(12) United States Patent
Gu

(10) Patent No.: US 8,482,334 B2
(45) Date of Patent: Jul. 9, 2013

(54) APPARATUS AND METHOD FOR REMOVING DC OFFSET IN POWER METER

(75) Inventor: Bon Young Gu, Gyeonggi-do (KR)

(73) Assignees: Samsung Electro-Mechanics Co., Ltd. (KR); Korea Electric Power Corporation (KR)

( * ) Notice: Subject to any disclaimer, the term of this patent is extended or adjusted under 35 U.S.C. 154(b) by 0 days.

(21) Appl. No.: 13/456,175

(22) Filed: Apr. 25, 2012

(65) Prior Publication Data

US 2013/0076427 A1 Mar. 28, 2013

(30) Foreign Application Priority Data

Sep. 27, 2011 (KR) ........................ 10-2011-0097818

(51) Int. Cl.
*H03L 5/00* (2006.01)
(52) U.S. Cl.
USPC .......................................... 327/307; 324/142
(58) Field of Classification Search
None
See application file for complete search history.

(56) References Cited

U.S. PATENT DOCUMENTS

| | | | | |
|---|---|---|---|---|
| 4,229,703 A * | 10/1980 | Bustin | ............................ | 327/307 |
| 5,198,751 A * | 3/1993 | Nakamura | ..................... | 324/141 |
| 6,321,073 B1 * | 11/2001 | Luz et al. | .................... | 455/239.1 |
| 6,538,490 B2 * | 3/2003 | Yoshizawa | ..................... | 327/307 |
| 2002/0175671 A1 * | 11/2002 | Nestler | .......................... | 324/142 |
| 2006/0028197 A1 | 2/2006 | Quiquempoix | | |
| 2010/0061485 A1 * | 3/2010 | Clark et al. | .................... | 375/319 |
| 2011/0105070 A1 * | 5/2011 | Li et al. | ...................... | 455/226.2 |

FOREIGN PATENT DOCUMENTS

| | | |
|---|---|---|
| JP | 2001-333117 A | 11/2001 |
| JP | 2006-025365 A | 1/2006 |
| JP | 2008-181617 A | 8/2008 |
| KR | 10-2008-0028961 A | 4/2008 |

* cited by examiner

*Primary Examiner* — Tuan T Lam
(74) *Attorney, Agent, or Firm* — Blakely Sokoloff Taylor & Zafman

(57) ABSTRACT

Disclosed herein are an apparatus and a method for removing a DC offset in a power meter. The apparatus for removing a DC offset in a power meter according to exemplary embodiment includes: an ADC; a HPF removing the DC offset from the signal output from the ADC; a selector receiving the signals passing through the HPF and bypassing the HPF and outputting any one thereof; a determination block receiving a signal output from the ADC or from the selector and determining whether the received signal is a sinusoidal signal; an offset calculation block calculating the DC offset to be compensated from the signal input to the determination block or output from the selector; and an offset compensation unit disposed on a path bypassing the HPF, compensating the calculated DC offset value in the signal output from the ADC and outputting the compensated result to the selector.

16 Claims, 5 Drawing Sheets

APPARATUS AND METHOD FOR REMOVING DC OFFSET IN POWER METER

CROSS REFERENCE(S) TO RELATED APPLICATIONS

This application claims the benefit under 35 U.S.C. Section 119 of Korean Patent Application Serial No. 10-2011-0097818, entitled "Apparatus and Method for Removing DC Offset in Power Meter" filed on Sep. 27, 2011, which is hereby incorporated by reference in its entirety into this application.

BACKGROUND OF THE INVENTION

1. Technical Field

The present invention relates to an apparatus and a method for removing a DC offset in a power meter. More particularly, the present invention relates to an apparatus and a method for appropriately removing a DC offset in a power meter according to a pattern of an input signal.

2. Description of the Related Art

A power meter receives a voltage and current signal to calculate power. The voltage and current signal is an analog signal and is therefore converted into a digital signal using an analog-digital converter (ADC). A DC offset is generated during a process of converting the analog signal into a digital signal and therefore, errors occur in calculating power. Therefore, DC component may be removed using a high pass filter (HPF) or a DC removal logic in a voltage channel and a current channel.

In the related art, a method of multiplying an output signal from the ADC by a gain and then, passing the multiplied output signal through an HPF to remove the DC offset has been used. The current and voltage used in the power eter are generally a sinusoidal wave of 50 Hz or 60 Hz and an average value of the sinusoidal wave is generally '0'. Therefore, when there is the DC offset, the DC offset may be removed using the HPF or the DC removal logic. However, when a half-wave rectified signal that is a non-sinusoidal wave having, for example, a DC offset of 0.2, the DC offset of 0.2 is removed, but a distorted signal waveform appears due to the HPF.

SUMMARY OF THE INVENTION

An object of the present invention is to provide an apparatus and a method for removing a DC offset in a power meter including components for removing a non-sinusoidal DC offset, together with the HPF for removing a sinusoidal DC offset, so as to remove a DC offset value in real time by selecting a method for appropriately removing a DC offset by detecting a pattern of an input signal.

According to an exemplary embodiment of the present invention, there is provided an apparatus for removing a DC offset in a power meter, including: an analog-digital converter converting an analog signal into a digital signal; a high pass filter (HPF) removing the DC offset from the signal output from the analog-digital converter in an enabling state; a selector receiving the signal passing through the high pass filter and the signal bypassing the high pass filter and outputting any one thereof; a determination block receiving the signal output from the analog-digital converter or receiving the signal output from the selector and so determining whether the received signal is a sinusoidal signal or not; an offset calculation block calculating the DC offset to be compensated from the signal input to the determination block or the signal output from the selector; and an offset compensation unit disposed on a path bypassing the high pass filter, compensating the DC offset value calculated from the offset calculation block in the signal output from the analog-digital converter and outputting the compensated result to the selector.

The high pass filter may remove the DC offset from the sinusoidal signal output from the analog-digital converter and the offset compensation unit may compensate the DC offset value calculated from the offset calculating block in the non-sinusoidal signal output from the analog-digital converter.

The determination block may receive the signal output from the analog-digital converter and so determine whether the received signal is the sinusoidal signal or not, and control the high pass filter to be enabled in case that the determination result is the sinusoidal signal and control the high pass filter to be bypassed and the signal bypassing the high pass filter to be provided to the offset compensation unit in case that the determination result is the non-sinusoidal signal.

The determination block may use an RMS value of the input signal or determine whether a DC period of the input signal is detected so as to determine whether the received signal is the sinusoidal signal or not.

The high pass filter may be operated in an enabling state at an early stage, and the determination block may receive the signal passing through the high pass filter and output from the selector and so determine whether the received signal is the sinusoidal signal or not, and control the enabling state of the high pass filter to be maintained in case that the determination result is the sinusoidal signal and controls the high pass filter to be bypassed and the signal bypassing the high pass filter to be provided to the offset compensation unit in case that the determination result is the non-sinusoidal signal.

The determination block may determine whether the received signal is the sinusoidal signal using the RMS value of the input signal.

The selector may be controlled according to the determination result of the determination block and output the signal having passed through the high pass filter in case that the determination result is the sinusoidal signal and output the signal provided from the offset compensation unit in case that the determination result is the non-sinusoidal signal.

The offset calculation block may calculate the DC offset to be compensated from the signal input to the determination block or the signal output from the selector in case that the determination result is the non-sinusoidal signal according to the determination of the determination block.

According to another exemplary embodiment of the present invention, there is provided a method for removing a DC offset in a power meter, including: converting an analog signal into a digital signal; receiving the converted digital signal and determining whether the received signal is a sinusoidal signal or not; removing the DC offset from the converted digital signal by maintaining a high pass filter (HPF) in an enabling state; receiving in a selector a signal passing through the high pass filter and a signal bypassing the high pass filter and outputting any one thereof; calculating the DC offset to be compensated by receiving the converted digital signal or the signal output from the selector; and compensating the calculated DC offset value in the converted digital signal bypassing the high pass filter and providing the compensated result to the selector.

The sinusoidal signal may pass through the high pass filter and so the DC offset is removed in the passing signal and the non-sinusoidal signal may bypass the high pass filter and the DC offset value may be added to the signal bypassing the high pass filter, according to the determination result in the determining step.

In the determining step, it may be determined whether the received signal is the sinusoidal signal or not, by using an RMS value of the input signal or determining whether a DC period of the input signal is detected.

In the outputting step, the signal passing through the high pass filter may be output in case that the determination result is the sinusoidal signal and the signal added with the DC offset and so provided to the selector may be output in case that the determination result is the non-sinusoidal signal, by the control according to the determination result in the determining step.

According to another exemplary embodiment of the present invention, there is provided a method for removing a DC offset in a power meter, including: converting an analog signal into a digital signal; removing the DC offset from the converted digital signal by maintaining a high pass filter (HPF) in an enabling state; receiving in a selector a signal passing through the high pass filter and a signal bypassing the high pass filter and outputting any one thereof; receiving a signal output from the selector and determining whether the received signal is a sinusoidal signal or not; calculating the DC offset to be compensated by receiving the signal output from the selector; and compensating the calculated DC offset value in the converted digital signal bypassing the high pass filter and providing the compensated result to the selector.

The high pass filter may be operated in an enabling state at an early stage and remove the DC offset, and the sinusoidal signal may pass through the high pass filter and the DC offset may be removed in the passing signal and the non-sinusoidal signal may bypass the high pass filter and the DC offset value may be added to the signal bypassing the high pass filter, according to the determination result in the determining step.

In the determining step, it may be determined whether the received signal is the sinusoidal signal by using an RMS value of the input signal.

In the outputting step, the signal passing through the high pass filter may be output in case that the determination result is the sinusoidal signal and the signal added with the DC offset and so provided to the selector may be output in case that the determination result is the non-sinusoidal signal, by the control according to the determination result in the determining step.

DESCRIPTION OF THE PREFERRED EMBODIMENTS

Figure 1:
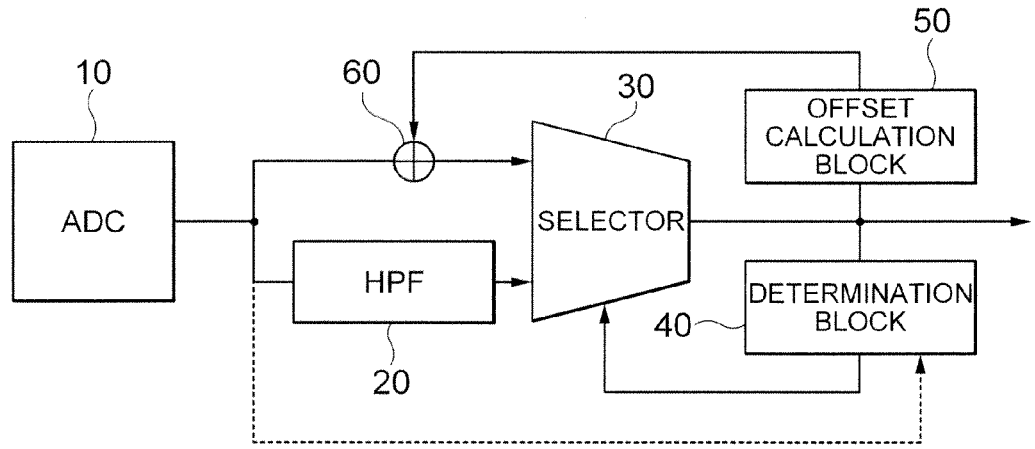
FIG. 1 is a block diagram schematically showing an apparatus for removing a DC offset in a power meter according to an exemplary embodiment of the present invention.

Exemplary embodiments of the present invention for accomplishing the above-mentioned objects will be described with reference to the accompanying drawings. In describing exemplary embodiments of the present invention, the same reference numerals will be used to describe the same components and an additional description that is overlapped or allow the meaning of the present invention to be restrictively interpreted will be omitted.

It will be understood that when an element is simply referred to as being 'connected to' or 'coupled to' another element without being 'directly connected to' or 'directly coupled to' another element in the present description, it may be 'directly connected to' or 'directly coupled to' another element or be connected to or coupled to another element, having the other element intervening therebetween.

Although a singular form is used in the present description, it may include a plural form as long as it is opposite to the concept of the present invention and is not contradictory in view of interpretation or is used as clearly different meaning.

It should be understood that "include", "have", "comprise", "be configured to include", and the like, used in the present description do not exclude presence or addition of one or more other characteristic, component, or a combination thereof.

First, an apparatus for removing a DC offset in a power meter according to a first exemplary embodiment of the present invention will be described in detail with reference to the accompanying drawings.

Figure 2A:
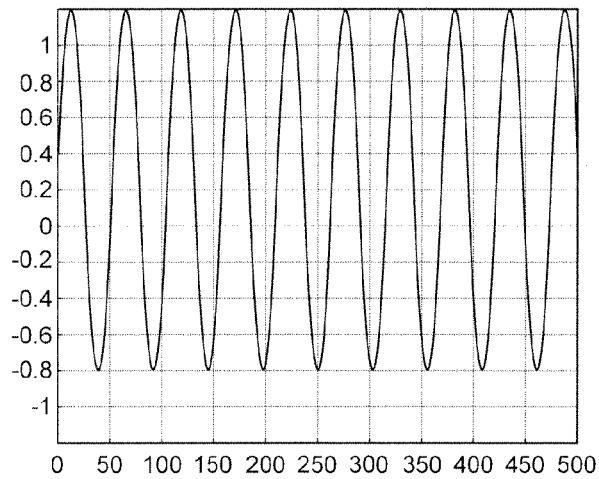
FIGS. 2A-2B are diagrams showing an appearance in which a sinusoidal wave including a DC offset passes through the apparatus for removing a DC offset in a power meter according to an exemplary embodiment of the present invention.
Figure 2B:
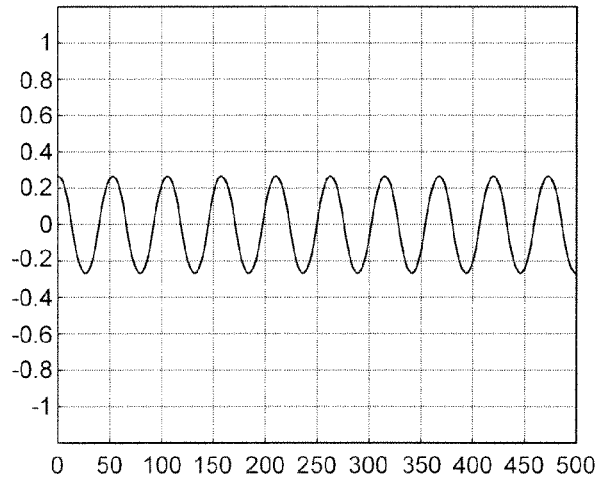
Figure 3A:
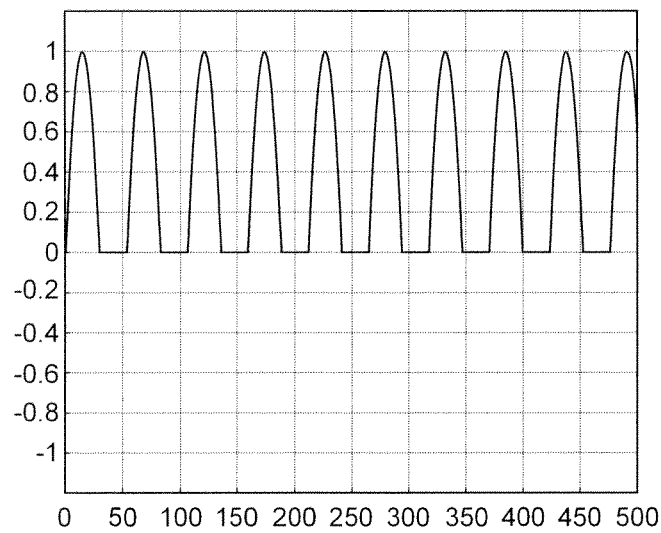
FIGS. 3A-3B are diagrams showing an appearance in which a half-wave rectification wave without the DC offset and a half-wave rectification wave with the DC offset pass through the apparatus for removing a DC offset in a power meter according to the exemplary embodiment of the present invention.
Figure 3B:
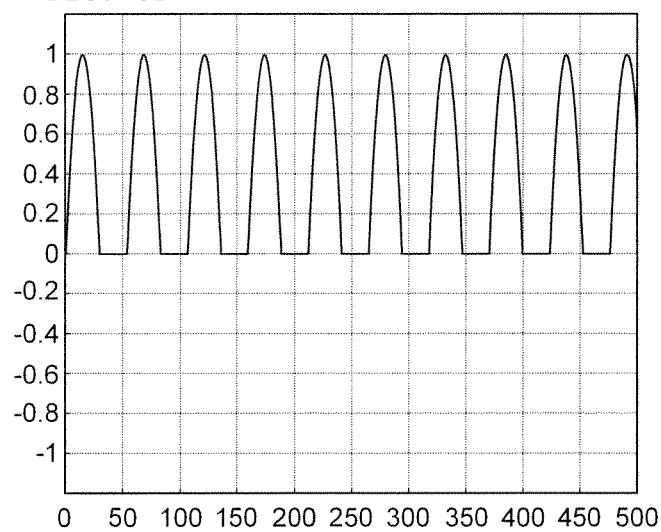
Figure 4A:
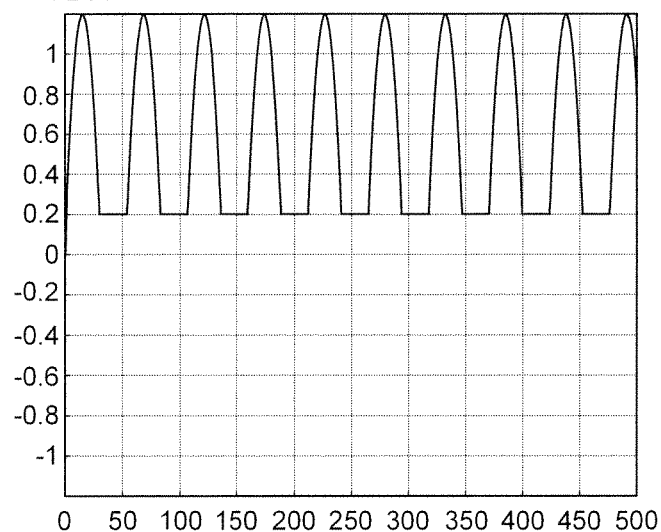
FIGS. 4A-4B are diagrams showing an appearance in which a half-wave rectification wave without the DC offset and a half-wave rectification wave with the DC offset pass through the apparatus for removing a DC offset in a power meter according to the exemplary embodiment of the present invention.
Figure 4B:
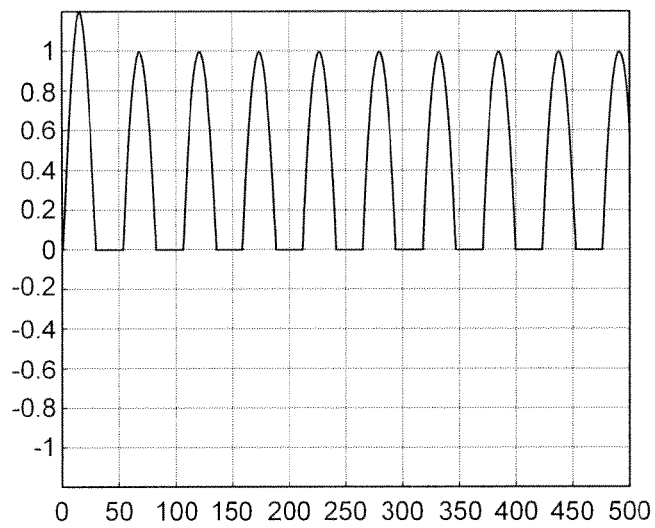

FIG. 1 is a block diagram schematically showing an apparatus for removing a DC offset in a power meter according to an exemplary embodiment of the present invention. FIG. 2 is a diagram showing an appearance in which a sinusoidal wave including a DC offset passes through the apparatus for removing a DC offset in a power meter according to an exemplary embodiment of the present invention and FIGS. 3 and 4 are diagrams showing an appearance in which a half-wave rectification wave without the DC offset and a half-wave rectification wave with the DC offset pass through the apparatus for removing a DC offset in a power meter according to the exemplary embodiment of the present invention.

Referring to FIG. 1, the apparatus for removing a DC offset in a power meter according to an exemplary embodiment of the present invention is configured to include an analog-digital converter 10, a high pass filter (HPF) 20, a selector 30, a determination block 40, an offset calculation block 50, and an offset compensation unit 60.

In FIG. 1, the analog-digital converter 10 converts an analog signal into a digital signal. In this case, the analog signal is a signal that is detected and input from a current sensor and a voltage sensor detecting a current signal and a voltage signal.

In addition, the high pass filter (HPF) 20 of FIG. 1 removes the DC offset from a signal output from the analog-digital converter 10 in an enabling state. When the high pass filter 20 is in a disabling state, the signal output from the analog-digital converter 10 is transferred to a path bypassing the high pass filter 20. The high pass filter 20 serves to remove the DC offset. The HPF 20 may be enabled or disabled by setting a register value.

According to the exemplary embodiment of the present invention, the high pass filter 20 may be operated in an enabling state at an early stage. When the high pass filter 20 is operated in the enabling state at an early stage, the determination block 40 may receive a signal passing through the high pass filter 20 or a signal output from a selector 30 and so determine whether the received signals are the sinusoidal wave. The digital conversion signal passes through the high pass filter 20 at an early operation and the determination block 40 determines whether the passed signal is the sinusoidal wave. If it is determined that the passed signal is the sinusoidal wave, the high pass filter 20 continues to be maintained in the enabling state and if the passed signal is a non-sinusoidal wave, for example, if it is determined that the passed signal is a half-wave rectification wave, the high pass filter 20 is in a disabling state, such that the non-sinusoidal wave output from the analog-digital converter 10 is provided to the path bypassing the high pass filter 20.

According to another exemplary embodiment of the present invention, the high pass filter 20 removes the DC offset from the sinusoidal signal output from the analog-digital converter 10.

Referring to FIG. 2, the input represents the sinusoidal wave having the DC offset of 0.2 and the output represents the sinusoidal wave from which the DC offset is removed through the HPF 20.

Next, the selector 30 of FIG. 1 receives the signal passing through the high pass filter 20 and the signal bypassing the high pass filter 20 and outputs any one thereof. The selector 30 provides one of two input signals and therefore, may be configured by, for example, a switch and may be configured using a multiplexer.

In addition, according to the exemplary embodiment of the present invention, the selector 30 is controlled according to the determination result of the determination block 40. In this configuration, the selector 30 outputs the signal having passed through the high pass filter 20 when the determination result is the sinusoidal wave and outputs the signal provided from the offset compensation unit 60 when the determination result is the non-sinusoidal wave.

Next, the determination block 40 of FIG. 1 receives the signal output from the analog-digital converter 10 or receives the signal output from the high pass filter 20 or the selector 30 and so determines whether the input signals are the sinusoidal signal.

According to the exemplary embodiment of the present invention, the determination block 40 receives the signal output from the analog-digital converter 10 and so determines whether the input signal is the sinusoidal signal. In an example, the determination block 40 determines whether the signal is the sinusoidal wave or the non-sinusoidal wave, for example, a half-wave rectification wave. In this case, the determination block 40 performs a control to enable the high pass filter 20, if it is determined that the signal is the sinusoidal wave. If it is determined that the signal is the non-sinusoidal wave, the determination block 40 controls the high pass filter 20 to be disabled or the signal output from the analog-digital converter 10 to bypass the high pass filter 20 and so provide to the offset compensation unit 60. The determination block 40 disables the HPF 20 if it is determined that the signal is the non-sinusoidal signal, for example, the half-wave rectified signal or bypasses the HPF 20, thereby preventing the distortion of the input signal. In this case, the signal does not pass through the HPF 20 and therefore, the DC offset present in the input signal may not be removed. Therefore, the signal needs to be compensated by the DC offset, which is compensated by calculating the DC offset value from the offset compensation unit 60 and adding the calculated DC offset value.

In this case, according to another example, the determination block 40 uses an RMS value of the input signal or determines whether a DC period of the input signal is detected, thereby determining whether the signal is the sinusoidal signal.

A method for differentiating the sinusoidal signal and the half-wave rectified signal using the RMS will be described. Describing a case in which a peak-to-peak of the sinusoidal input signal is 2, the signal has the following RMS value.

1) Case in which there is No Offset

The RMS of the HPF input signal of the sinusoidal wave is 0.707107, the RMS of the HPF input signal of the half-wave rectification wave is 0.512989, the RMS of the HPF output signal of the sinusoidal wave is 0.184958, and the RMS of the HPF output signal of the half-wave rectification wave is 0.120693.

2) Case in which the Offset is 0.2 (>0)

The RMS of the HPF input signal of the sinusoidal wave is 0.743900, the RMS of the HPF input signal of the half-wave rectification wave is 0.661191, the RMS of the HPF output signal of the sinusoidal wave is 0.185682, and the RMS of the HPF output signal of the half-wave rectification wave is 0.121800.

3) Case in which the Offset is −0.2 (<0)

The RMS of the HPF input signal of the sinusoidal wave is 0.725681, the RMS of the HPF input signal of the half-wave rectification wave is 0.411267, the RMS of the HPF output signal of the sinusoidal wave is 0.184647, and the RMS of the HPF output signal of the half-wave rectification wave is 0.120215.

In the case of the sinusoidal wave, the RMS of the HPF output shows a larger value than 0.18 according to the presence of offset. On the other hand, when the half-wave rectification wave is input, the output has the RMS value of about 0.12. The determination block 40 may determine whether the input signal is the sinusoidal wave or the half-wave rectified sinusoidal wave by using the RMS values of the HPF input or the HPF output. Instead of the HPF output, the output from the selector 30 may be used.

As another method for differentiating the sinusoidal signal or the half-wave rectified signal in the determination block 40, there is a method for using a DC period of the input signal of the determination block 40. For example, the pattern of the input signal may be determined by storing 5 samples within 1 period of the input signal and using an absolute value of a difference between respective samples. When the input signal is the half-wave rectified signal, the DC period periodically appears. In the ideal DC period, the difference in the value between the samples becomes '0'. When the absolute value of the difference is a predetermined value or less by comparing with a defined value, it is possible to determine whether the input signal is the half-wave rectified signal. This case may determine the case in which the DC period appears in the input signal.

It is possible to determine whether the signal is the sinusoidal signal by another method. In order to determine the pattern of the input signal, the correlation may be used. When there is a pattern to be determined by the determination block 40, it is possible to determine the pattern of the input signal by storing the pattern and matching the stored pattern with the input signal.

According to another exemplary embodiment of the present invention, the determination block 40 receives the signal output from the high pass filter 20 or the signal output from the selector 30 passing through the high pass filter 20 and so determines whether the signal is the sinusoidal signal. In this case, the high pass filter 20 may be operated in an enabling state at an early stage. The determination block 40 performs a control to maintain the enabling state of the high pass filter 20 in case that the determination result is the sinusoidal wave and disable the high pass filter 20 or allow the signal output from the analog-digital converter 10 to bypass the high pass filter 20 and so to provide to the offset compensation unit 60, if it is determined that the signal is the non-sinusoidal wave.

In this case, according to an example, the determination block 40 may determine whether the signal is the sinusoidal signal by using the RMS value of the input signal.

Next, the offset calculation block 50 of FIG. 1 calculates the DC offset to be compensated from the signal input to the determination block 40 or the signal output from the selector 30.

In addition, according to the exemplary embodiment of the present invention, the offset calculation block 50 calculates the signal input to the determination block 40 or the DC offset to be compensated from the signal output from the selector 30.

In an example, the offset calculation block 50 may be additionally connected to the determination block 40.

In an example, when the non-sinusoidal signal, that is, half-wave rectified signal is input, the determination block 40 disables the HPF 20 and the offset calculation block 50 obtains the DC offset value, which is in turn compensated in the offset compensation unit 60, thereby removing the DC offset without distorting the signal.

Further, the offset compensation unit 60 of FIG. 1 is disposed on a path bypassing the high pass filter 20 and compensates the DC offset value calculated in the offset calculation block 50 in the signal output from the analog-digital converter 10 and outputs the compensated signal to the selector 30. In an example, the offset compensation unit 60 may be an adder.

According to another exemplary embodiment, the offset compensation unit 60 compensates the DC offset value calculated in the offset calculation block 50 in the non-sinusoidal signal output from the analog-digital converter 10.

An example of receiving the non-sinusoidal wave, that is, the half-wave rectified signal and removing the DC offset is shown in FIGS. 3 and 4. FIG. 3 shows an example where there is no DC offset and FIG. 4 shows an example where the DC offset is 0.2 (>0).

Referring to FIG. 4, it can be appreciated that the offset is not removed in a first period by first calculating the DC offset as 0 and a waveform from which the DC offset is removed from the next period by calculating the DC offset to be compensated as −0.2 and adding −0.2 in the adder is output.

Figure 5A:
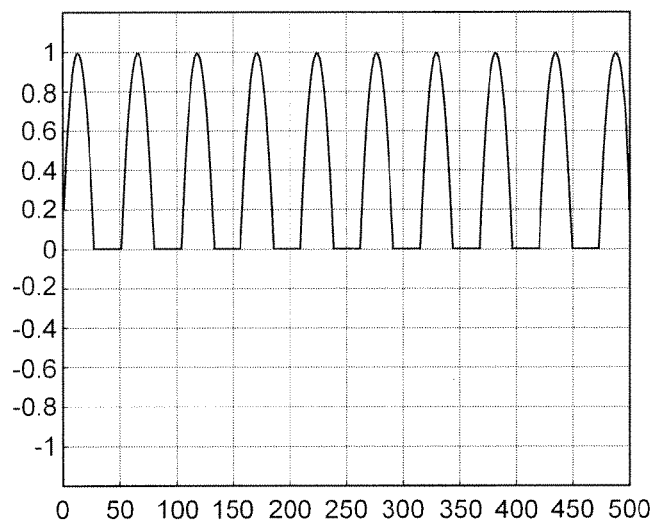
FIGS. 5A-5B are diagrams showing an appearance of the half-wave rectification without the DC offset in the power meter according to the related art, as compared with the exemplary embodiment of the present invention.
Figure 5B:
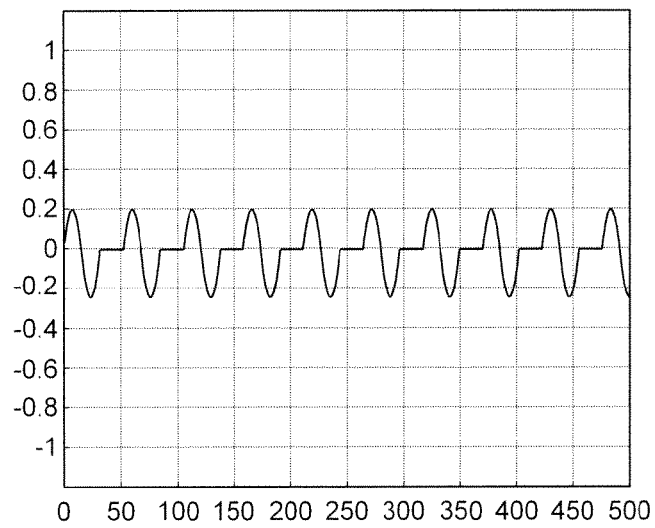

On the other hand, when using only the HPF of FIG. 5 according to the related art, it can be appreciated that the distorted signal is output when the non-sinusoidal wave, that is, the half-wave rectified signal is input.

According to the exemplary embodiment of the present invention, the DC offset value may be removed in real time by determining whether the signal is the sinusoidal wave or the non-sinusoidal wave, for example, the half-wave rectification wave by detecting the pattern of the input signal and selecting the method for appropriately removing the DC offset.

Next, a method for removing a DC offset in a power meter according to a second and third exemplary embodiment of the present invention will be described in detail with reference to the accompanying drawings. In describing the exemplary embodiments of the present invention, the exemplary embodiments of the apparatus for removing a DC offset in a power meter as described above and FIGS. 1 to 4 may be referred and therefore, repeated descriptions thereof will be omitted.

Figure 6:
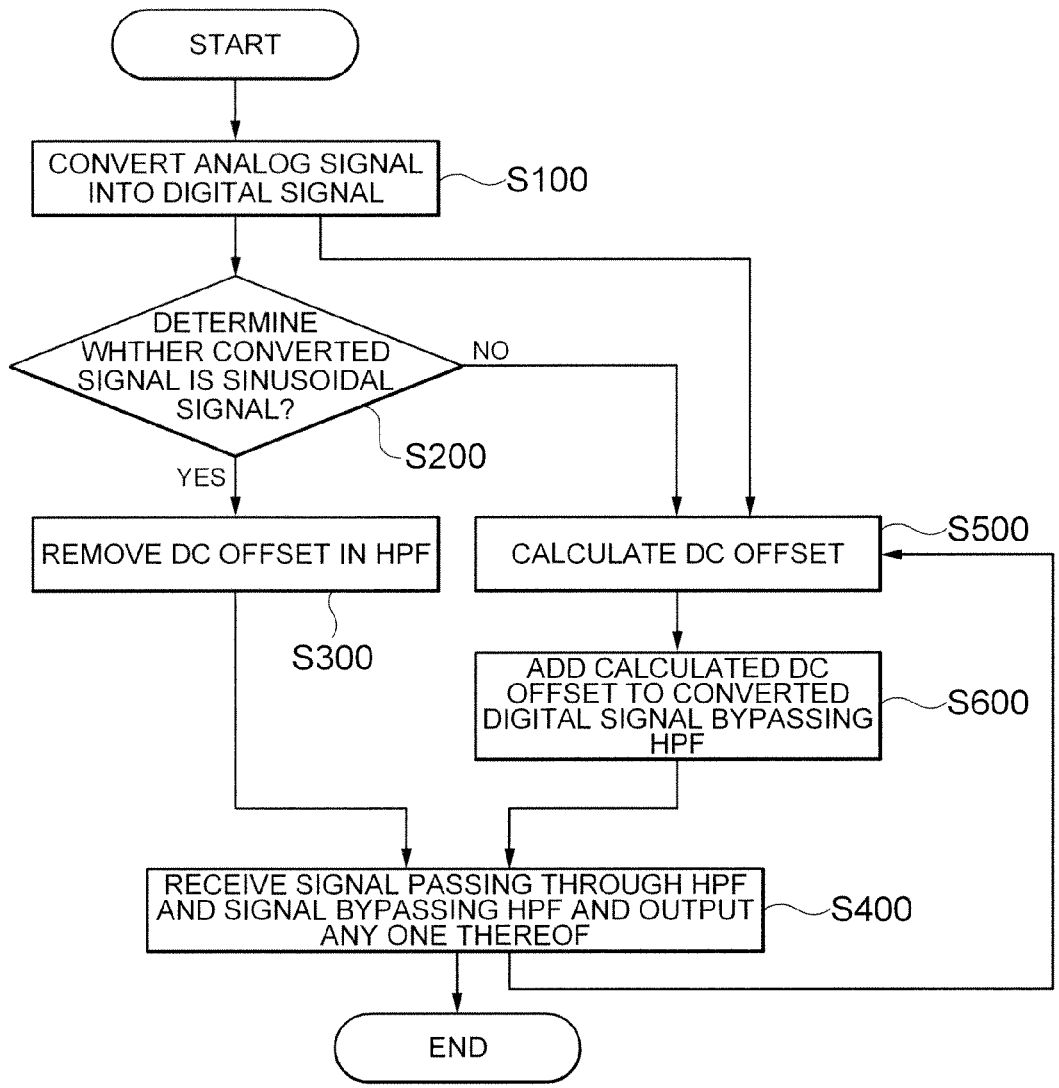
FIG. 6 is a flow chart schematically showing a method for removing a DC offset in a power meter according to the exemplary embodiment of the present invention.
Figure 7:
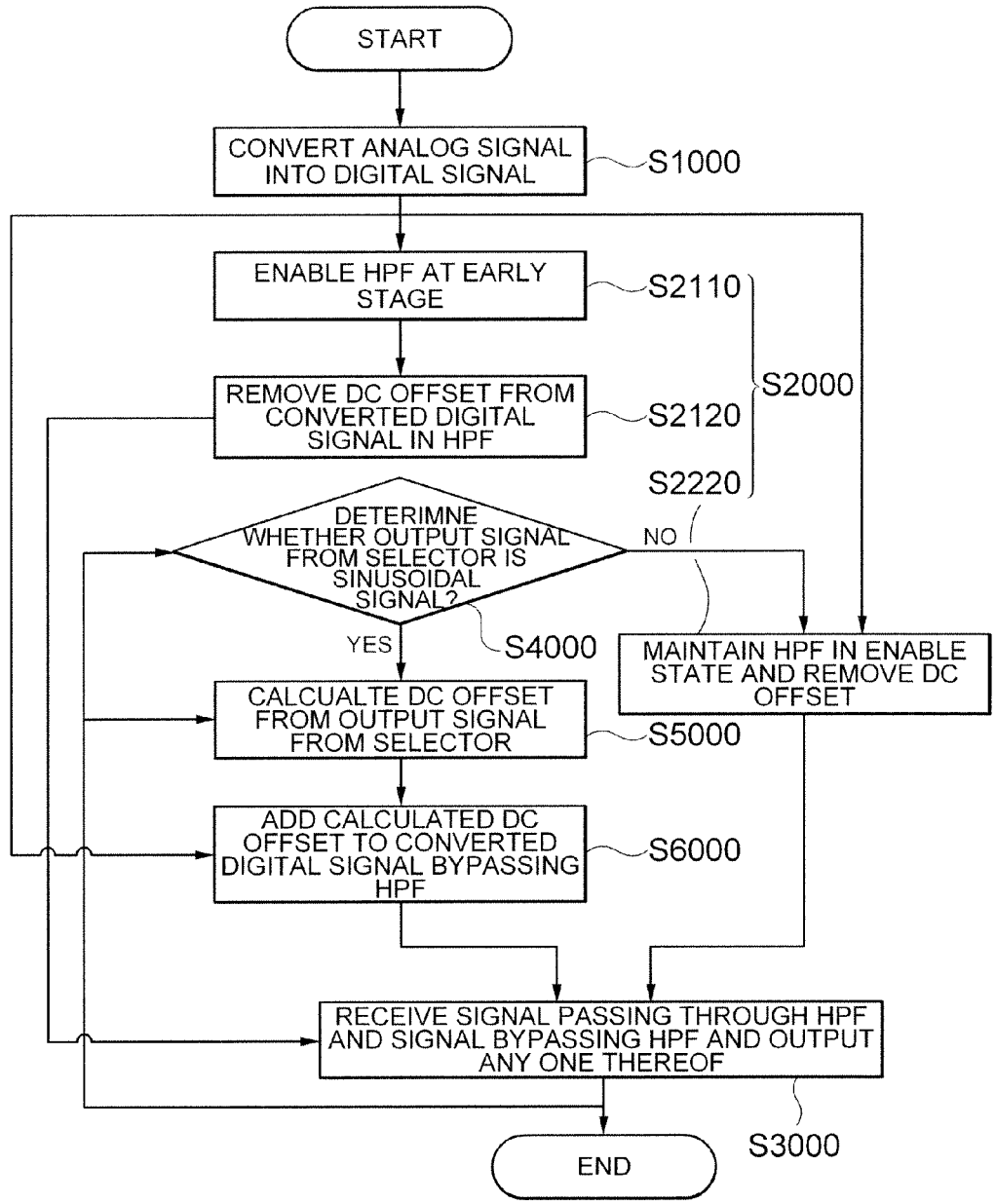
FIG. 7 is a flow chart schematically showing a method for removing a DC offset in a power meter according to another exemplary embodiment of the present invention.

FIG. 6 is a flow chart schematically showing a method for removing a DC offset in a power meter according to the exemplary embodiment of the present invention and FIG. 7 is a flow chart schematically showing a method for removing a DC offset in a power meter according to another exemplary embodiment of the present invention.

First, referring to FIG. 6, the method for removing a DC offset in a power meter according to the second exemplary embodiment of the present invention will be described.

Referring to FIG. 6, the method for removing a DC offset in a power meter according to the exemplary embodiment of the present invention is configured to include analog-digital converting (S100), determining (S200), removing offset (S300), outputting (S400), calculating offset (S500), and compensating offset (S600).

First, referring to FIG. 6, the input analog signal is converted into the digital signal in the analog-digital converting (S100). In this case, the input analog signal is a signal detected in the current sensor and the voltage sensor.

At the determining (S200) of FIG. 6, it is determined that the signal is the sinusoidal signal by receiving the converted digital signal.

Describing another exemplary embodiment with reference to FIG. 6, the sinusoidal signal passes through the high pass filter 20 according to the determination result at the determination (S200) to remove the DC offset (S300). According to the determination result, the non-sinusoidal signal bypasses the high pass filter 20 and the bypassed signal is added to the DC offset value in the compensating of the offset (S600).

In this case, according to another example, the determining (S200) uses the RMS value of the input signal or determines whether the DC period of the input signal is detected, thereby determining whether the signal is the sinusoidal signal.

Next, at the removing of the offset (S300) of FIG. 6, the high pass filter (HPF) 20 is in the enabling state to remove the DC offset from the converted digital signal.

Next, the outputting (S400) of FIG. 6 receives in the selector 30 the signal passing through the high pass filter 20 and the signal bypassing the high pass filter 20 and outputs any one thereof.

In addition, according to the exemplary embodiment of the present invention, the outputting (S400) may be controlled according to the determination result at the determining (S200). In this case, as the determination result at the determining (S200), if it is determined that the signal is the sinusoidal wave, the signal passing through the high pass filter 20 is output and as the determination result at the determining (S200), if it is determined that the signal is the non-sinusoidal wave, the signal added with the DC offset and provided to the selector 30 is output.

Next, at the calculating (S500) the offset of FIG. 6, the DC offset to be compensated is calculated by receiving the converted digital signal or the signal output from the selector 30.

Further, at the compensating (S600) of the offset of FIG. 6, the calculated DC offset value in the converted digital signal bypassing the high pass filter 20 is compensated, which is in turn provided to the selector 30. The signal to be provided to the selector again passes through the outputting (S400). In an example, the DC offset value to be compensated using the adder is added in the calibration of the offset (S600).

Referring to FIG. 7, the method for removing a DC offset in a power meter according to the third exemplary embodiment of the present invention will be described.

Referring to FIG. 7, the method for removing a DC offset in a power meter according to the exemplary embodiment of the present invention is configured to include analog-digital converting (S1000), removing offset (S2000), outputting (S3000), determining (S4000), calculating offset (S5000), and compensating offset (S6000).

Referring to FIG. 7, the input analog signal is converted into the digital signal at the analog-digital converting (S1000). In this case, the input analog signal is a signal detected in the current sensor and the voltage sensor.

Next, at the removing of the offset (S2000) of FIG. 7, the high pass filter (HPF) 20 is in the enabling state to remove the DC offset from the converted digital signal.

In addition, describing another exemplary embodiment with reference to FIG. 7, the high pass filter 20 is operated in the enabling state at an early stage (S2110) to remove the DC offset (S2120). In addition, according to the determination result at the determining (S4000), the sinusoidal signal passes through the high pass filter 20 to remove the DC offset (S2220). Further, according to the determination result at the determining (S4000), the non-sinusoidal signal bypasses the high pass filter 20 and the bypassed signal is added to the DC offset value through the compensating of the offset (S6000).

Next, the outputting (S3000) of FIG. 7 receives in the selector 30 the signal passing through the high pass filter 20 and the signal bypassing the high pass filter 20 and outputs any one thereof.

In addition, according to the exemplary embodiment of the present invention, the outputting (S3000) may be controlled according to the determination result at the determining (S4000). As the determination result at the determining (S4000) in case that the determination result is the sinusoidal signal, the signal passing through the high pass filter 20 is output at the outputting (S3000). Further, as the determination result at the determining (S4000) in case that the determination result is the non-sinusoidal signal, at the outputting (S3000), the signal added with the DC offset and provided to the selector 30 is output.

Next, at the determining (S4000) of FIG. 7, it is determined that the signal is the sinusoidal signal by receiving the signal output from the selector 30.

Further, according to an example, at the determining (S4000), it is possible to determine whether the signal is the sinusoidal signal by using the RMS value of the input signal.

Next, at the calculating (S5000) the offset of FIG. 7, the DC offset to be compensated is calculated by receiving the signal output from the selector 30.

Further, at the compensating (S6000) of the offset of FIG. 7, the converted digital signal bypassing the high pass filter 20 that is compensated with the calculated DC offset value is provided to the selector 30. The signal to be provided to the selector 30 is output by passing through the outputting (S3000).

As set forth above, the exemplary embodiments of the present invention can remove the DC offset value in real time by including the offset calculation block and the offset compensation unit for removing the non-sinusoidal wave DC offset, together with the HPF for removing the sinusoidal DC offset, as the appropriate DC offset removal unit by detecting the pattern of the input signal.

It is obvious that various effects directly stated according to various exemplary embodiment of the present invention may be derived by those skilled in the art from various configurations according to the exemplary embodiments of the present invention.

The accompanying drawings and the above-mentioned exemplary embodiments have been illustratively provided in order to assist in understanding of those skilled in the art to which the present invention pertains. In addition, the exemplary embodiments according to various combinations of the aforementioned configurations may be obviously implemented by those skilled in the art from the aforementioned detailed explanations. Therefore, various exemplary embodiments of the present invention may be implemented in modified forms without departing from an essential feature of the present invention. In addition, a scope of the present invention should be interpreted according to claims and includes various modifications, alterations, and equivalences made by those skilled in the art.

What is claimed is:

1. An apparatus for removing a DC offset in a power meter, comprising:
an analog-digital converter converting an analog signal into a digital signal;
a high pass filter (HPF) removing the DC offset from the signal output from the analog-digital converter in an enabling state;
a selector receiving the signal passing through the high pass filter and the signal bypassing the high pass filter and outputting any one thereof;
a determination block receiving the signal output from the analog-digital converter or receiving the signal output from the selector and so determining whether the received signal is a sinusoidal signal or not;
an offset calculation block calculating the DC offset to be compensated from the the digital signal inputted to the determination block or the signal output from the selector; and
an offset compensation unit disposed on a path bypassing the high pass filter, compensating the DC offset value calculated from the offset calculation block in the signal output from the analog-digital converter and outputting the compensated result to the offset compensation unit.

2. The apparatus according to claim 1, wherein the high pass filter removes the DC offset from the sinusoidal signal output from the analog-digital converter, and
the offset compensation unit compensates the DC offset value calculated from the offset calculating block in the non-sinusoidal signal output from the analog-digital converter.

3. The apparatus according to claim 1, wherein the determination block receives the signal output from the analog-digital converter and so determines whether the received signal is the sinusoidal signal or not, and controls the high pass filter to be enabled in case that the determination result is the sinusoidal signal and controls the high pass filter to be bypassed and the signal bypassing the high pass filter to be provided to the offset compensation unit in case that the determination result is the non-sinusoidal signal.

4. The apparatus according to claim 3, wherein the determination block uses an RMS value of the received signal or determines whether a DC period of the received signal is detected so as to determine whether the received signal is the sinusoidal signal or not.

5. The apparatus according to claim 1, wherein the high pass filter is operated in an enabling state at an early stage, and
the determination block receives the signal passing through the high pass filter and output from the selector and so determines whether the received signal is the sinusoidal signal or not, and controls the enabling state of the high pass filter to be maintained in case that the determination result is the sinusoidal signal and controls the high pass filter to be bypassed and the signal bypassing the high pass filter to be provided to the offset compensation unit in case that the determination result is the non-sinusoidal signal.

6. The apparatus according to claim 5, wherein the determination block determines whether the received signal is the sinusoidal signal using the RMS value of the received signal.

7. The apparatus according to claim 1, wherein the selector is controlled according to the determination result of the determination block and outputs the signal having passed through the high pass filter in case that the determination result is the sinusoidal signal and outputs the signal provided from the offset compensation unit in case that the determination result is the non-sinusoidal signal.

8. The apparatus according to claim 1, wherein the offset calculation block calculates the DC offset to be compensated from the digital signal inputted to the determination block or the signal output from the selector in case that the determination result is the non-sinusoidal signal.

9. A method for removing a DC offset in a power meter, comprising:
   converting an analog signal into a digital signal;
   receiving the converted digital signal and determining whether the received signal is a sinusoidal signal or not;
   removing the DC offset from the converted digital signal by maintaining a high pass filter (HPF) in an enabling state;
   receiving in a selector a signal passing through the high pass filter and a signal bypassing the high pass filter and outputting any one thereof;
   calculating the DC offset to be compensated by receiving the converted digital signal or the signal output from the selector; and
   compensating the calculated DC offset value in the converted digital signal bypassing the high pass filter and providing the compensated result to the signal bypassing.

10. The method according to claim 9, wherein the sinusoidal signal passes through the high pass filter and so the DC offset is removed in the passing signal and the non-sinusoidal signal bypasses the high pass filter and the DC offset value is added to the signal bypassing the high pass filter, according to the determination result in the determining step.

11. The method according to claim 10, wherein, in the determining step, it is determined whether the received signal is the sinusoidal signal or not, by using an RMS value of the received signal or determining whether a DC period of the received signal is detected.

12. The method according to claim 9, wherein, in the outputting step, the signal passing through the high pass filter is output in case that the determination result is the sinusoidal signal and the signal added with the DC offset and so provided to the selector is output in case that the determination result is the non-sinusoidal signal, by the control according to the determination result in the determining step.

13. A method for removing a DC offset in a power meter, comprising:
   converting an analog signal into a digital signal;
   removing the DC offset from the converted digital signal by maintaining a high pass filter (HPF) in an enabling state;
   receiving in a selector a signal passing through the high pass filter and a signal bypassing the high pass filter and outputting any one thereof;
   receiving a signal output from the selector and determining whether the received signal is a sinusoidal signal or not;
   calculating the DC offset to be compensated by receiving the signal output from the selector; and
   compensating the calculated DC offset value in the converted digital signal bypassing the high pass filter and providing the compensated result to the signal bypassing.

14. The method according to claim 13, wherein the high pass filter is operated in an enabling state at an early stage and remove the DC offset, and the sinusoidal signal passes through the high pass filter and so the DC offset is removed in the passing signal and the non-sinusoidal signal bypasses the high pass filter and the DC offset value is added to the signal bypassing the high pass filter, according to the determination result in the determining step.

15. The method according to claim 14, wherein, in the determining step, it is determined whether the received signal is the sinusoidal signal or not, by using an RMS value of the received signal.

16. The method according to claim 13, wherein, in the outputting step, the signal passing through the high pass filter is output in case that the determination result is the sinusoidal signal and the signal added with the DC offset and so provided to the selector is output in case that the determination result is the non-sinusoidal signal, by the control according to the determination result in the determining step.

* * * * *